(12) United States Patent
Wakaki et al.

(10) Patent No.: US 9,048,390 B2
(45) Date of Patent: Jun. 2, 2015

(54) PACKAGE FOR LIGHT EMITTING DEVICE, AND LIGHT EMITTING DEVICE

(71) Applicant: NICHIA CORPORATION, Anan-shi, Tokushima (JP)

(72) Inventors: Takayoshi Wakaki, Anan (JP); Hiroyuki Tanaka, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/255,315

(22) Filed: Apr. 17, 2014

(65) Prior Publication Data

US 2014/0312364 A1 Oct. 23, 2014

(30) Foreign Application Priority Data

Apr. 18, 2013 (JP) .................................. 2013-087488
Mar. 28, 2014 (JP) .................................. 2014-069851

(51) Int. Cl.

| H01L 23/12 | (2006.01) |
|---|---|
| H01L 33/40 | (2010.01) |
| H01L 33/62 | (2010.01) |
| H01L 33/60 | (2010.01) |
| H01L 25/075 | (2006.01) |
| H01L 33/44 | (2010.01) |
| H01L 33/52 | (2010.01) |

(52) U.S. Cl.
CPC .............. *H01L 33/405* (2013.01); *H01L 33/62* (2013.01); *H01L 33/60* (2013.01); *H01L 25/0753* (2013.01); *H01L 33/44* (2013.01); *H01L 33/52* (2013.01); *H01L 2224/48137* (2013.01); *H01L 2224/48247* (2013.01); *H01L 2224/49113* (2013.01); *H01L 2224/8592* (2013.01); *H01L 2924/0002* (2013.01)

(58) Field of Classification Search
CPC ....... H01L 33/60; H01L 33/62; H01L 33/486; H01L 21/486; H01L 2224/48137; H01L 2224/48247
USPC ......... 257/79, 80, 98–100, E21.506, 33.06, 66
See application file for complete search history.

(56) References Cited

U.S. PATENT DOCUMENTS

| 8,044,162 B2 * | 10/2011 | Morita et al. .................. 528/32 |
| 8,592,836 B2 * | 11/2013 | Yokotani et al. ............... 257/88 |
| 2007/0268694 A1 * | 11/2007 | Bailey et al. .................. 362/231 |
| 2011/0039374 A1 * | 2/2011 | Lin et al. ...................... 438/118 |

(Continued)

FOREIGN PATENT DOCUMENTS

| JP | 2006-319109 A | 11/2006 |
| JP | 2009-224538 A | 10/2009 |

(Continued)

*Primary Examiner* — Michael Lebentritt
(74) *Attorney, Agent, or Firm* — Foley & Lardner LLP

(57) ABSTRACT

A package for a light emitting device includes: a resin portion having a sidewall thereof; a first lead having a reflective layer containing silver, the first lead being embedded in the resin portion such that the reflective layer is exposed inside the sidewall; and a second lead having at least a part of a surface thereof exposed inside the sidewall, the second lead being embedded in the resin portion while being isolated from the first lead, wherein in the first lead, the reflective layer is provided spaced inward apart from a boundary between the first lead and the resin portion, and wherein a separating surface exposed between the boundary and the reflective layer is formed of a surface of metal containing silver in a smaller amount than that of the reflective layer.

20 Claims, 4 Drawing Sheets

(56) References Cited

U.S. PATENT DOCUMENTS

2011/0215366 A1* 9/2011 Tsukagoshi et al. ............ 257/99
2011/0275180 A1* 11/2011 Lin et al. ...................... 438/122
2012/0049225 A1 3/2012 Wakaki
2012/0098006 A1* 4/2012 Chen et al. ...................... 257/98

FOREIGN PATENT DOCUMENTS

| JP | 2012-069539 A | 4/2012 |
| JP | 2012-160580 A | 8/2012 |
| JP | 2013-038373 A | 2/2013 |

* cited by examiner

PACKAGE FOR LIGHT EMITTING DEVICE, AND LIGHT EMITTING DEVICE

CROSS-REFERENCE TO RELATED APPLICATION

This application claims priority to Japanese Patent Application No. 2013-087488, filed on Apr. 18, 2013, and No. 2014-069851, filed on Mar. 28, 2014. The entire disclosure of Japanese Patent Application No. 2013-087488 and No. 2014-069851 are hereby incorporated herein by reference.

BACKGROUND

1. Field of the Invention

The present disclosure relates to a package for a light emitting device using a lead with silver formed on its surface, and a light emitting device.

2. Description of the Related Art

Light emitting devices are known which include a reflective layer containing silver around a light emitting element to thereby improve its output. In such light emitting devices, the change in color of the reflective layer might reduce the output of light emission. For this reason, some light emitting devices are proposed to form a protective layer of inorganic material on the reflective layer, thereby suppressing darkening of the light emitting element due to sulfurization of the reflective layer (hereinafter referred to as a single "sulfurization") (see, for example, Patent Literature 1: JP 2009-224538 A).

In a conventional light emitting device, however, even the formation of the protective layer may sulfurize an Ag element of the reflective layer over time, leading to a decrease in output.

SUMMARY

Therefore, it is an object of the present invention to provide a package for a light emitting device that can suppress the sulfurization of a reflective layer by forming a protective layer with a light emitting element mounted thereon, and also a light emitting device that can suppress the sulfurization of the reflective layer to maintain a high light output.

A package for a light emitting device according to the present invention includes:

a resin portion having a sidewall thereof; a first lead having a reflective layer containing silver, the first lead being embedded in the resin portion such that the reflective layer is exposed inside the sidewall; and a second lead having at least a part of a surface thereof exposed inside the sidewall, the second lead being embedded in the resin portion while being separated from the first lead, wherein in the first lead, the reflective layer is provided spaced inward apart from a boundary between the first lead and the resin portion, and wherein a separating surface exposed between the boundary and the reflective layer is formed of a surface of metal containing silver in a smaller amount than that of the reflective layer.

A light emitting device according to the present invention includes:

a package for the light emitting device;

one or more light emitting elements provided on the reflective layer; and a protective layer covering the first lead and the light emitting element.

With the arrangement mentioned above, the present invention can provide a package for a light emitting device that can suppress the sulfurization of a reflective layer by forming a protective layer with the light emitting element mounted thereon.

The light emitting device according to the present invention can maintain a high light output.

DETAILED DESCRIPTION OF THE EMBODIMENT

Preferred embodiments for carrying out the present invention will be described below with reference to the accompanying drawings. The embodiments mentioned below are only illustrative to embody the technical idea of the present invention, and not intended to limit the scope of the present invention. The dimension, material, shape, relative position, and the like of components mentioned in the embodiments are illustrative rather than limiting the scope of the present invention unless otherwise specified. In some drawings, the sizes or positional relationships of members, and the like are emphasized to clarify the description below.

First Embodiment

Figure 1:
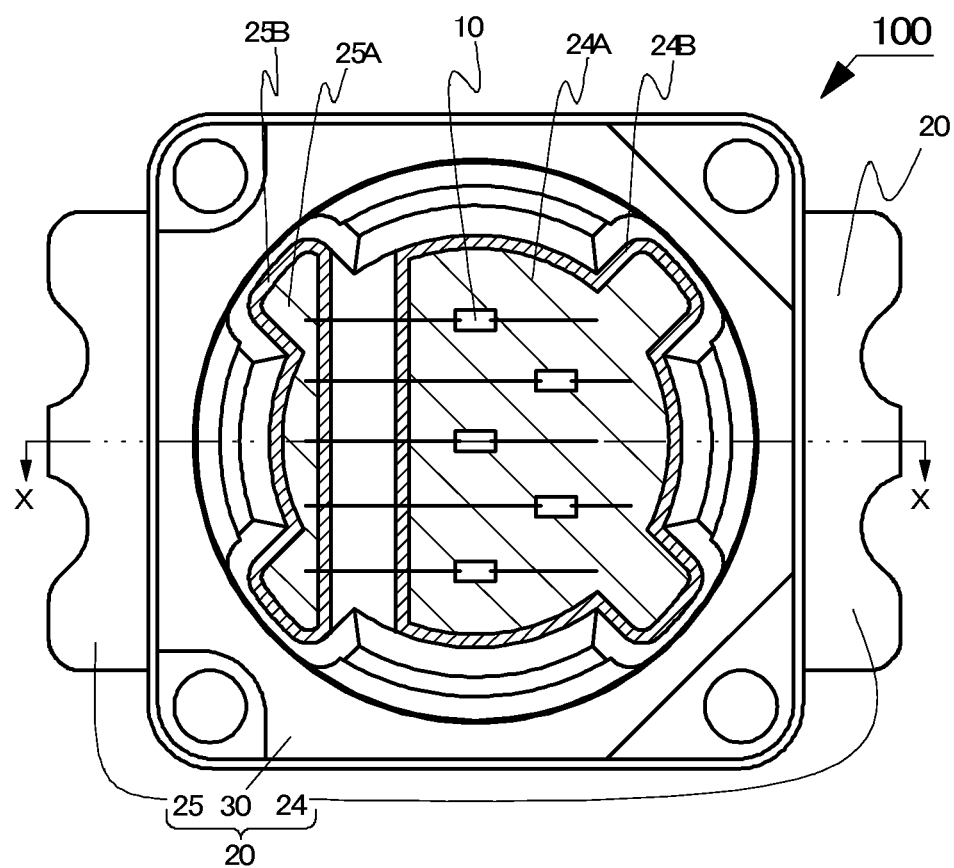
FIG. 1 is a diagram of a light emitting device viewed from a light emitting surface side according to a first embodiment of the present invention.
Figure 2:
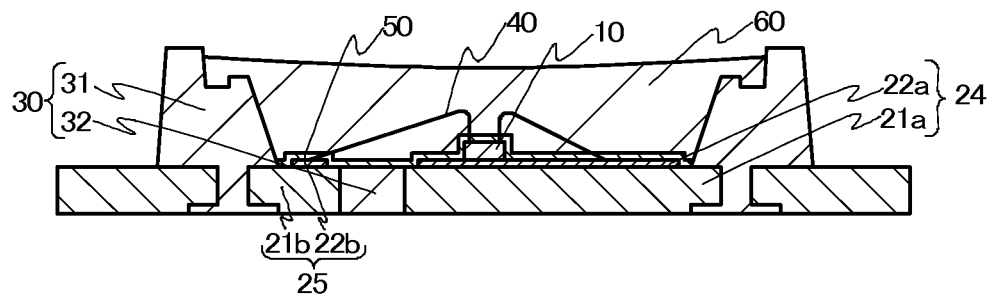
FIG. 2 is a schematic cross-sectional view of the light emitting device shown in FIG. 1.

FIG. 1 shows a diagram of a light emitting device 100 viewed from a light emitting surface side in this embodiment. For easy understanding, in FIG. 1, surfaces of reflective layers (first regions) 24A and 25A are indicated by wide hatching, and separating surfaces thereof (second regions) 24B and 25B are indicated by narrow hatching (note that the same goes for FIGS. 4 and 6). FIG. 2 shows a schematic cross-sectional view of the light emitting device 100 (which is a cross-sectional view taken along the line X-X of FIG. 1). Referring to each figure, the light emitting device 100 includes a package 20 including a resin portion 30 with a sidewall 31, a first lead 24, and a second lead 25; one or more light emitting element 10 disposed on the first lead 24 in a region inside the sidewall 31; and a protective layer 50 covering the resin portion 30, the first lead 24, and the light emitting element 10 in the region inside the sidewall 31. The protective layer 50 covers not only the first lead 24 and the light emitting element 10, but also the entire region within the sidewall 31. Thus, the surface of the second lead 25 exposed in the region inside the sidewall 31 and the surface of the base portion 32 of the resin portion 30 are also covered with the protective layer 50.

The structure of the package 20 and the entire structure of the light emitting device 100 will be described below.

In the light emitting device 100 of the first embodiment, the package 20 includes the first lead 24 and second lead 25, and the resin portion 30 including the sidewall 31 which surrounds the light emitting element mounted and the base portion 32 which electrically isolates and physically holds the first lead 24 and second lead 25.

The first lead 24 includes a base member 21a formed of metal and a reflective layer 22a containing silver formed on an upper surface of the base member 21a. The first lead 24 is embedded in the resin portion 30 so as to expose the reflective layer 22a in the region inside the sidewall 31. The second lead 25 is embedded in the resin portion 30 such that at least a part of its surface is exposed in the region inside the sidewall 31 and is electrically separated from the first lead 24. Like the first lead 24, in the package 20 of the first embodiment, the second lead 25 includes a base member 21b formed of metal, and a reflective layer 22b formed on an upper surface of the base member 21b. The reflective layer 22b is exposed in the region inside the sidewall 31. In the present specification, the term "on" refers to not only direct contact but also indirect contact. For example, the reflective layer 22a may be formed on the upper surface of the base member 21a with the other member intervened therebetween.

When the first lead 24 is buried in the resin portion 30, the reflective layer 22a of the first lead 24 is formed to be spaced apart and exposed inward from a boundary between the first lead 24 and the resin portion 30. Specifically, in the first lead 24, when the first lead 24 is buried in the resin portion 30, a surface (hereinafter referred to as separating surface) is exposed between the reflective layer 22a and the boundary of the first lead 24 and the resin portion 30. The separating surface is comprised of a surface formed of metal which contains silver in a smaller amount than that in the reflective layer 22a. The term "metal containing silver in a small amount" as used in the present specification includes metal not containing silver. In the first embodiment, the base member 21a is formed of metal not containing silver. The base member 21a has its surface exposed as the separating surface.

In the first embodiment, the second lead 25 also has the structure as that of the first lead 24.

That is, when the second lead 25 is buried in the resin portion 30, the reflective layer 22b of the second lead 25 is formed to be spaced apart and exposed inward from a boundary between the second lead 25 and the resin portion 30. In the second lead 25, when the second lead 25 is buried in the resin portion 30, a surface (hereinafter referred to as separating surface) is exposed between the reflective layer 22b and the boundary of the second lead 25 and the resin portion 30. The separating surface is comprised of a surface formed of metal which contains silver in a smaller amount than that in the reflective layer 22b. Specifically, in the first embodiment, like the first lead 24, the base member 21b is formed of metal not containing silver. The base member 21b has its surface exposed as the separating surface.

In the package 20 with the above-mentioned structure of the first embodiment, when viewing the region inside the sidewall 31 from the light emitting surface side, the respective two leads, namely, the first and second leads 24 and 25 include the surfaces (first regions) 24A and 25A of the reflective layers containing silver, and spaced apart inward from the boundary between the lead and resin portion 30. Further, the first and second leads 24 and 25 also include the separating surfaces (second regions) 24B and 25B of metal each containing silver in a smaller amount than that of the reflective layers 22a and 22b, and surrounding the surfaces (first regions) 24A and 25A of the reflective layers adjacent to the boundary between each of the first and second leads 24 and 25 and the resin portion 30.

The light emitting device 100 includes the package 20 for the light emitting device of the first embodiment, one or more light emitting elements 10 provided on the reflective layer 22a of the first lead 24, and the protective layer 50 covering the first lead 24, the light emitting elements 10, and the base portion 32 of the resin portion 30.

The light emitting device with the above-mentioned structure can suppress the sulfurization of the reflective layers 22a and 22b, and thus can maintain the output at a high level over a long time. This advantage will be described in detail below.

In the light emitting device 100, the first and second leads 24 and 25 are covered by the protective layer 50, whereby in theory the first and second leads 24 and 25 might not be exposed to elements that may degrade the characteristics of the leads. However, in the case where the metal surface which contains in a large amount of silver is extended to the boundary between the resin portion 30 and each of the first and second leads 24 and 25, the silver existing near the boundary is first sulfurized and then the sulfurization may spread throughout the metal surface. This is because there is a large difference in thermal expansion coefficient between the resin material of the resin portion 30 and the metal as the material of the first and second leads 24 and 25, which might cause cracking in the protective layer 50 at the interface therebetween, inducing the sulfurization of the silver. Further, in the course of time, the sulfurization may spread into the first and second leads 24 and 25, resulting in further reduction of the output.

In this embodiment, in addition to the surfaces (first regions) 24A and 25A of the reflective layer containing silver, the separating surfaces (second regions) 24B and 25B formed of metal containing silver in a smaller amount than that of the reflective layers 22a and 22b (not containing silver in this embodiment) is provided around the surfaces (first regions) 24A and 25A of the reflective layers. That is, the surface parts of the first and second leads 24 and 25 adjacent to the resin portion 30 which tend to be inherently sulfurized are provided with the separating surfaces (second regions) 24B and 25B formed of metal containing silver in a smaller amount than that of the reflective layers 22a and 22b (not containing silver in this embodiment). This arrangement can suppress the occurrence of the sulfurization at the surfaces of the first and second leads 24 and 25. As a result, this can advantageously reduce the inward progress of the sulfurization over the time.

As can be seen from the above description, one or more light emitting elements 10 are provided on the reflective layer 22a of the first lead 24 using the package 20 for the light emitting device of the first embodiment, and the protective layer 50 is formed to cover the first lead 24, the light emitting element 10, and the base portion 32 of the resin portion 30, which can suppress the sulfurization of the reflective layer.

Thus, this embodiment can provide the light emitting device that can maintain a high light output for a long time.

The main components of the light emitting device 100 will be described below. For convenience of explanation, the "light emitting surface side of the light emitting device 100" as used in the present specification is hereinafter referred to as an upper side (upper part of FIG. 2), and the opposite side to the above-mentioned upper side is hereinafter referred to as a lower side (lower part of FIG. 2).

(Light Emitting Element 10)

For example, a LED (light emitting diode) may be used as the light emitting element 10. The light emitting element 10 used in this embodiment is the LED, for example, which is made of a nitride semiconductor and which may emit blue light. As shown in FIGS. 1 and 2, the light emitting element 10 is provided with both a p-electrode (positive electrode) and an n-electrode (negative electrode) on its upper surface side (on the same surface side), which are respectively electrically connected to the first and second leads 24 and 25 via wires 40.

Here, one light emitting device uses a plurality of light emitting elements 10. Alternately, one light emitting device may also use one light emitting element 10. Further, the light emitting element 10 with the p electrode formed on one side of a semiconductor portion via the semiconductor portion, and the n electrode formed on the other side may also be used. Obviously, the light emitting element 10 that emits light in any colors other than blue may be used.

(First and Second Leads 24 and 25)

The light emitting device 100 respectively includes two metal leads, namely, the first and second leads 24 and 25. The material, structure, size, and the like of the respective first and second leads 24 and 25 may be the same or different.

In the light emitting device 100, the two first and second leads 24 and 25 exposed from the resin portion 30 in the region inside the sidewall 31 are opposed to each other via a part of the resin portion 30 (base portion 32 of the resin portion) in the planar view (see FIGS. 1 and 2). The first and second leads 24 and 25 include, in the region inside the sidewall 31, the surfaces (first regions) 24A and 25A of the reflective layers 22*a* and 22*b* containing silver and spaced apart inward from the boundary between the first lead 24 and the resin portion 30 and the boundary between the second lead 25 and the resin portion 30, as well as the separating surfaces (second regions) 24B and 25B of metal, respectively, disposed adjacent to the boundary between each of the first and second leads 24 and 25 and the resin portion 30 to surround the respective surfaces (first regions) 24A and 25A of the reflective layers, and containing silver in a smaller amount than that of the reflective layer. As shown in FIGS. 1 and 2, the surfaces (first regions) 24A and 25A of the reflective layer are disposed to be completely spaced apart from the boundary between the resin portion 30 and the first and second lead 24 or 25, respectively. The separating surfaces (second regions) 24B and 25B are disposed to surround the respective entire peripheries (first regions) 24A and 25A of the reflective layers.

In the light emitting device 100, each of the two first and second leads 24 and 25 includes the base member 21*a* or 21*b* and the reflective layer 22*a* or 22*b* partly formed on the base member 21*a* or 21*b*. The term "as viewed from the light emitting surface side" as used herein means not only the state in which the surfaces (first regions) 24A and 25A of the reflective layers and the separating surfaces (second regions) 24B and 25B may be directly viewed from the light emitting surface side, but also the state in which the first and second regions cannot be directly viewed because these regions are covered by another member. For example, when the seal member 60 containing a phosphor member in a large amount is charged into the region inside the sidewall 31, the surfaces (first regions) 24A and 25A of the reflective layers and the separating surfaces (second regions) 24B and 25B cannot be directly viewed from the light emitting surface side. Even in this case, when there are regions corresponding to the surfaces (first regions) 24A and 25A of the reflective layers and the separating surfaces (second regions) 24B and 25B under the seal member 60, the above state is considered to fall in the scope of the present invention.

In the light emitting device 100, the two first and second leads 24 and 25 are provided with the surfaces (first regions) 24A and 25A of the reflective layers (reflective layers 22), respectively. Alternatively, either the first lead 24 or second lead 25 may be provided with the surface (first region) 24A or 25A of the reflective layer.

The base members 21*a* and 21*b* may be formed, for example, by processing a metal, such as copper, a copper alloy, iron, an iron alloy, or aluminum, into a plate.

Each surface of the reflective layers 22*a* and 22*b* includes silver which has a high reflectivity but is susceptible to sulfurization. In the light emitting device 100, however, the existence of the separating surfaces (second regions) 24B and 25B can suppress the sulfurization of the reflective layers 22*a* and 22*b*, whereby the high reflectivity of the silver can be maintained for a long time while making the most effective use of the high reflectivity.

In this embodiment, in order to ensure the large surfaces (first regions) 24A and 25A of the reflective layers for reflecting the light, the separating surface (second regions) 24B and 25B with a certain width are formed along the boundary between each of the first and second leads 24 and 25 and the resin portion 30. In use of the normal-sized light emitting element 10, the width of the separating surfaces (second regions) 24B and 25B may be in a range of 1 µm or more and 20 µm or less, preferably 3 µm or more and 10 µm or less, and more preferably 3 µm or more and 5 µm or less. Setting the width of the separating surface up to a certain value or more may reduce the occurrence of defectives even though a mask is misaligned upon forming the reflective layer 22*a* or 22*b*. In contrast, setting the width of the separating surface down to another certain value or less may take the surfaces (first regions) 24A and 25A of the reflective layers as large as possible.

The thickness of each of the reflective layers 22*a* and 22*b* may be 0.1 µm or more and 10 µm or less, preferably 0.5 µm or more and 5 µm or less, and more preferably 0.5 µm or more and 3.5 µm or less. Setting the thickness of the reflective layer up to a certain value or more facilitates the formation of the wire 40. In contrast, setting the thickness thereof down to another value or less can drastically exhibit the effect of suppressing the sulfurization.

The reflective layers 22*a* and 22*b* may be formed by the known methods, such as sputtering, and preferably by electroplating. At this time, by masking the separating surfaces (second regions) 24B and 25B, the reflective layers 22*a* and 22*b* (first regions 24A and 25A) may be formed on the predetermined positions. Thus, upon forming the reflective layers 22*a* and 22*b*, the amount of use of silver can be decreased, which can reduce the manufacturing cost.

The light emitting elements 10 are mounted on the surfaces (first regions) 24A and 25A of the reflective layers. By mounting the light emitting elements 10 on the surfaces (first regions) 24A and 25A of the reflective layers, the light not emitted from the light emitting surface side of the light emitting element 10 (that is, light emitted from the side or lower parts of the light emitting element 10) can be reflected upward and taken out, which can increase the output from the light emitting device.

In the light emitting device 100, the first and second leads 24 and 25 include the base member 21*a* and 21*b*, and the reflective layers 22*a* and 22*b* partly formed on the respective surfaces of the base members 21*a* and 21*b*, respectively. In this embodiment, however, the separating surface may be formed of the surface of metal containing silver in a smaller amount. Thus, as shown in the cross-sectional view of FIG. 3, each of the first and second leads 24 and 25 may include the base member 21, the coated layer 23*a* or 23*b* covering the corresponding base member 21*a* or 21*b* and formed of metal containing silver in a smaller amount than that of the reflective layer, and the reflective layer 22a or 22b partly formed on the corresponding coated layer 23a or 23b. In this case, when viewing the region inside the sidewall 31 from the light emitting surface side, the surfaces of the coated layers 23a and 23b without the reflective layers 22a and 22b correspond to the separating surfaces (second regions) 24B and 25B. That is, in this case, the coated layer 23 is exposed at the separating surfaces (second regions) 24B and 25B as viewed from the upper surface of FIG. 1.

Figure 3:
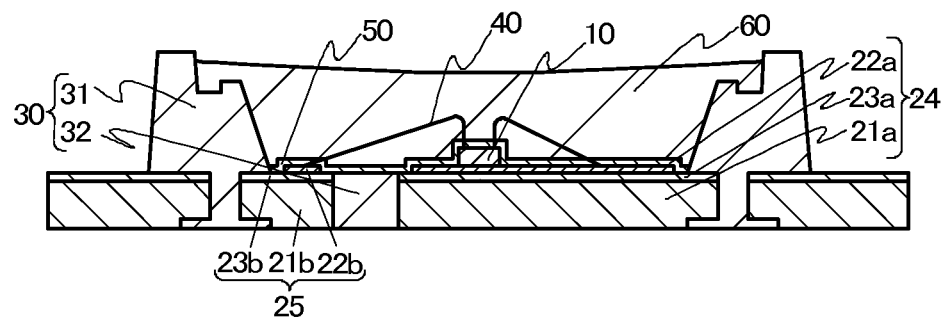
FIG. 3 is a schematic cross-sectional view of modification of the light emitting device shown in FIG. 1.

In the structure shown in FIG. 3, for example, the base members 21a and 21b may be formed of metal not containing silver, and the coated layers 23a and 23b may be formed of metal containing silver in a smaller amount than that of the reflective layers 22a and 22b and in a larger amount than that of the base members 21a and 21b. In this way, the coated layers 23a and 23b is formed of metal containing silver in a smaller amount than that of the reflective layers 22a and 22b, and in a larger amount than that of the base members 21a and 21b. This structure can suppress the reduction in output while lessening the effect of suppressing the degradation of the light emitting device. This is because the separating surfaces (second regions) 24B and 25B containing silver having a high reflectivity can reduce the light absorbed in the base members 21a and 21b.

The coated layers 23a and 23b are provided mainly for covering the base members 21a and 21b respectively, to increase the reflectivity thereof. Thus, the coated layers 23a and 23b may be formed using, for example nickel, palladium, gold, or silver alloy, but preferably a silver alloy containing silver in a smaller amount than that of the surfaces (first regions) 24A and 25A of the reflective layer. Each of the coated layers 23a and 23b may be formed of a single layer, or a plurality of layers including a laminate of one or more conductive layers made of a different material from that of the reflective layers 22a and 22b.

(Resin Portion 30)

The resin portion 30 in the light emitting device 100 is made of a resin, and normally integrally formed with the first and second leads 24 and 25. The resin portion 30 in the light emitting device 100 includes the base portion 32 and sidewall 31. The sidewall 31 is protruded to form a recessed portion. In the light emitting device 100, a groove is provided in the sidewall 30 to prevent the seal member 60 from flowing over the sidewall 31 when forming the seal member 60. However, the groove may not be provided.

Suitable materials for the resin portion 30 for use may be material having electrical insulating properties with excellent resistance to light and heat, for example, a thermoplastic resin such as poly(phthalamide), and a thermosetting resin such as an epoxy resin or a silicone resin.

(Wire 40)

The wire 40 is to electrically connect the light emitting element 10 to the first and second leads 24 and 25. Suitable materials for the wire 40 for use may include metal, such as gold, silver, copper, platinum, and aluminum, especially, silver having a high reflectivity. The diameter of the wire 40 is not specifically limited, but may be appropriately selected according to the purpose and application.

The light emitting elements 10 in the light emitting device 100 are provided on the reflective layer 22a formed on the first lead 24. One of the p-electrode and n-electrode of the light emitting element 10 is electrically connected to the first lead 24 by the wire 40, while the other electrode is electrically connected to the second lead 25 by the wire 40. In the first embodiment shown in FIG. 1, the light emitting elements are connected in parallel between the first lead 24 and the second lead 25. Various connection methods may be used for this connection. For example, all the light emitting elements 10 are connected in series. Alternatively, a series circuit including the light emitting elements 10 connected in series and another series circuit including the other light emitting elements 10 connected in series may be connected in parallel to each other.

The wire 40 may be formed by the known methods, but preferably formed by a ball bonding having excellent bonding strength. A starting end and a terminating end of the wire 40 may be appropriately set. For example, in the case where the starting end of the wire 40 is at the light emitting element 10 (specifically, an electrode of the light emitting element 10) and the terminating end of the wire 40 is at the first and second leads 24 and 25 (specifically, the surfaces (first regions) 24A and 25A of the reflective layers of the first and second leads 24 and 25). In this case a ball is formed in advance on each of the first and second leads 24 and 25 as the terminating end, and then the wire 40 is bonded to the light emitting element 10 as the starting end. Then, a capillary is moved to the terminating end, and as a result, the wire 40 can be terminated (cut) on the ball. Finally, when the seal member 60 is charged into the periphery of the wire 40, the wire 40 is sometimes pulled upward due to the thermal expansion of the seal member 60. However, this method involving previously forming the balls on the first and second leads 24 and 25 is less likely to generate a clearance between the ball and each of the surfaces (first regions) 24A and 25A of the reflective layers serving as a bonding surface even through the wire is pulled upward, which can prevent the sulfurization of the surfaces (first regions) 24A and 25A of the reflective layer due to cracking formed in the protective layer 50 on the surfaces (first regions) 24A and 25A of the reflective layer.

(Protective Layer 50)

The protective layer 50 is to suppress the degradation of the properties of the reflective layers 22a and 22b. Normally, the protective layer 50 continuously covers the first and second leads 24 and 25 exposed inside the sidewall 31 and parts of the base portion 32 of the resin portion 30 intervening in between the first and second leads. The protective layer 50 may also be formed on the surface of the wire 40, the sidewall 31 of the resin portion 30 and the like. Suitable materials for the protective layer 50 for use may include inorganic materials, such as aluminum oxide, or silicon oxide.

The protective layer 50 may be formed, for example, by an atomic layer deposition method (hereinafter simply referred to as an "ALD"). The use of the ALD may form the protective layer 50 having an excellent protective capability as compared to the use of sputtering or vapor deposition. The protective layer 50 formed by the ALD method has good properties, and thus can greatly suppress the sulfurization of the first and second leads 24 and 25 directly under the protective layer 50. However, when cracking is caused in the protective layer 50 at the boundary between the first and second leads 24 and 25 and the resin portion 30, sulfurization might start from the vicinity of the cracking as a starting point. In contrast, in the light emitting device 100 of the first embodiment, even though cracking is caused in the protective layer 50, the amount of silver located in the position that could act as the starting point of the sulfurization becomes small (nearly zero) at the separating surfaces (second regions) 24B and 25B, which can effectively suppress the sulfurization of the first and second leads 24 and 25. Thus, this embodiment is very effective, particularly, in use of the protective layer 50 formed by the ALD. When the protective layer 50 is formed by the ALD, the protective layer is formed not only on the portion shown in FIG. 2 but also on a surface of the wire 40 and an entire surface of the package (including a surface of the sidewall 30, surfaces of the lead and the resin portion 30 that are exposed at an outside of the sidewall 30 and at a bottom side of the package). In such a case, the protective layer formed on the surfaces of each of the leads and the resin portion 30 that are exposed at a bottom side of the package may be removed by way of blasting. The protective layer formed on the surface of the wire 40 and the surface of the sidewall 30 may remain without removing.

Alternatively, after forming the protective layer 50, a reflection member may also be provided to cover the protective layer formed at the separating surfaces (second regions) 24B and 25B. This case can improve the light extraction efficiency as compared to the case of not using the reflection member. In other words, a part of light from the light emitting element is inherently absorbed in the separating surfaces (second regions) 24B and 25B, but the provision of the reflection member allows the light to be reflected toward the light emitting surface side. In this case, in order not to cause new cracking in the protective layer by forming the reflection member, it is necessary to select material for the reflection member and a method of formation thereof. For example, the sticking force between the reflection member and the protective layer 50 is made weaker than that between the protective layer 50 and the reflective layers 22a and 22b, which can prevent the cracking in the protective layer. Specifically, the material for the reflection member may include, for example, a resin containing a light reflective filler.

(Seal Member 60)

The seal member 60 may be charged into the region inside the sidewall 31 of the resin portion 30. Material for the seal member 60 is not limited as long as the material allows the light emitted from the light emitting element 10 to pass through toward the outside. Suitable material for the seal member 60 for use may be resin materials, including, for example, a silicone resin, an epoxy resin, and the like.

The seal member 60 may also contain a phosphor member that includes one or more phosphor materials and becomes luminous when irradiated with the light from the light emitting element 10. The phosphor material for use may be the known one. When the light emitting element 10 emits blue light, the phosphor material may be a YAG phosphor, a LAG phosphor, a TAG phosphor, or a strontium silicate phosphor, and the like for emitting yellow light, so that the entire light emitting device can produce white light.

The seal member 60 may also contain a light-scattering member which includes one or more light-scattering materials. The use of the seal member 60 containing the light-scattering member can produce the light emitting device 100 that suppresses color unevenness. The light-scattering material for use may include, for example, silicon oxide, aluminum oxide, and the like.

Second Embodiment

Figure 4:
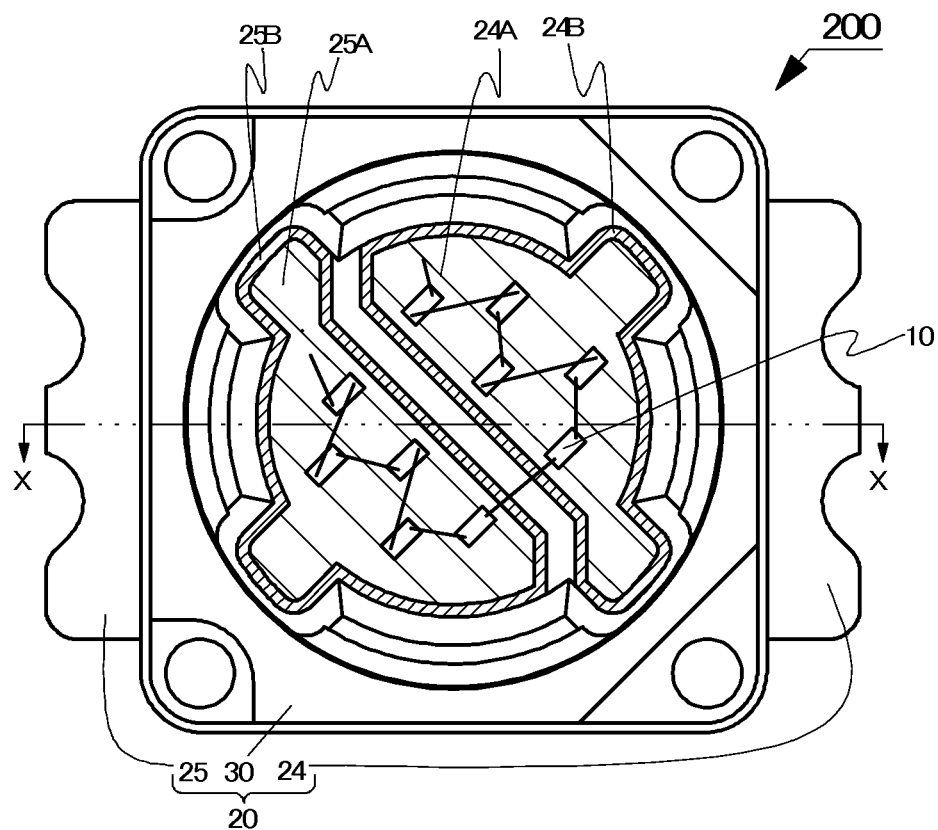
FIG. 4 is a diagram of a light emitting device viewed from a light emitting surface side according to a second embodiment of the present invention.
Figure 5:
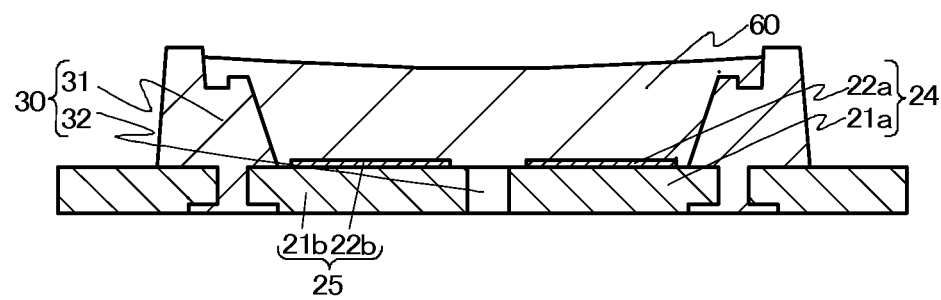
FIG. 5 is a schematic cross-sectional view for explaining the light emitting device shown in FIG. 4.

FIG. 4 shows a diagram of a light emitting device 200 as viewed from a light emitting surface side in a second embodiment. FIG. 5 is a schematic cross-sectional view taken along the line X-X of FIG. 4. FIG. 5 shows the schematic structures of the base members 21a and 21b, the reflective layers 22a and 22b, the resin portion 30, and the seal member 60. The light emitting device 200 has substantially the same structure as that mentioned in the first embodiment except for points mentioned below.

In the light emitting device 200, upon viewing the region inside the sidewall 31 from the light emitting surface side, the light emitting elements 10 are arranged on the first lead 24 and the second lead 25. The width of the base portion 32 of the resin portion formed between the first lead 24 and the second lead 25 in this embodiment is narrow as compared to that in the first embodiment such that the light emitting element 10 provided on the first lead 24 is not so far from the light emitting element 10 provided on the second lead 25.

Like the first embodiment, the decrease in light output can be reduced due to the suppression of the sulfurization of the reflective layers 22a and 22b, and further the light emitting elements 10 can be uniformly arranged in the region inside the sidewall 31, which can suppress variations in light emission.

Third Embodiment

Figure 6:
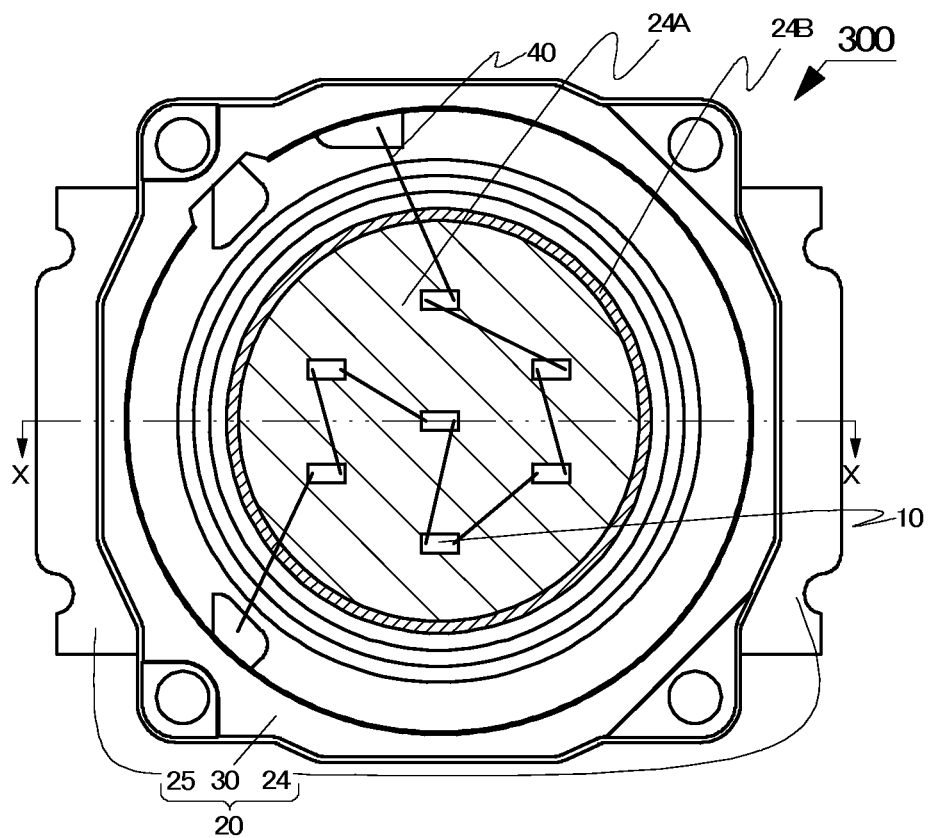
FIG. 6 is a diagram of a light emitting device viewed from a light emitting surface side according to a third embodiment of the present invention.
Figure 7:
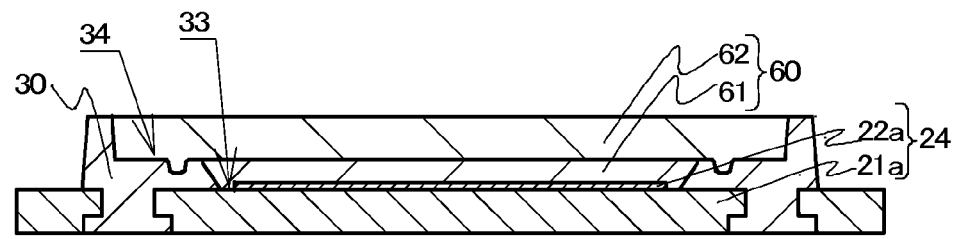
FIG. 7 is a schematic cross-sectional view for explaining the light emitting device shown in FIG. 6.
Figure 8:
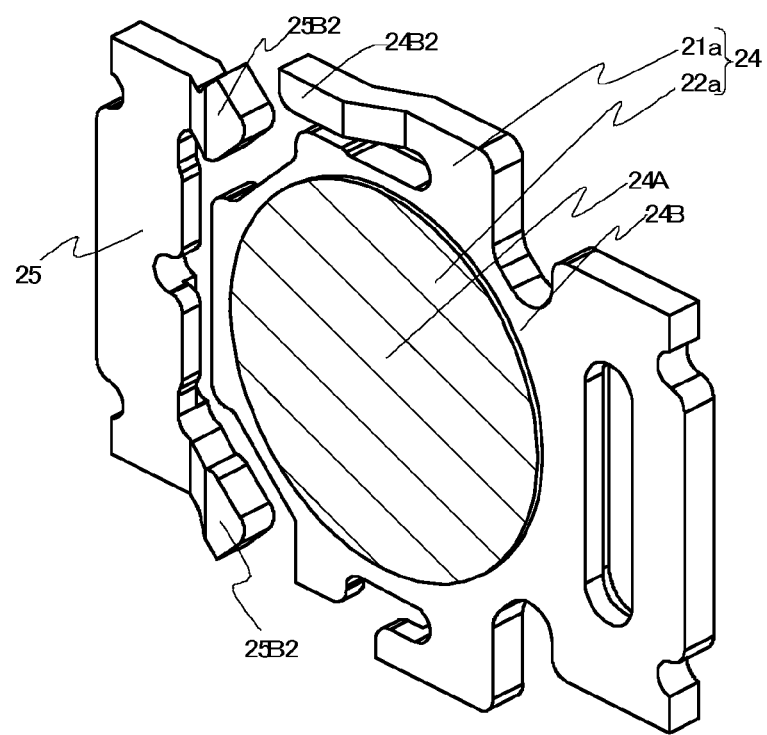
FIG. 8 is a perspective view for explaining the light emitting device shown in FIG. 6.

FIG. 6 shows a diagram of a light emitting device 300 viewed from a light emitting surface side in this embodiment. FIG. 7 is a schematic cross-sectional view taken along the line X-X of FIG. 6. FIG. 7 shows the schematic structure of the base member 21a, the reflective layer 22a, the resin portion 30, and the seal member 60. For easy understanding the structures of the first and second leads 24 and 25 used in the light emitting device 300, FIG. 8 shows the perspective view of only the first and second leads 24 and 25 (the left back end of the second lead 25 shown in FIG. 8 corresponds to the left end of each of FIGS. 6 and 7, and the right front end of the first lead 24 shown in FIG. 8 corresponds to the right end of each of FIGS. 6 and 7). For easy understanding of the structure in FIG. 8, the surface (first region) 24A of the reflective layer 22a is hatched. The light emitting device 300 has substantially the same structure as that mentioned in the first embodiment except for points mentioned below.

In the light emitting device 300, the sidewall 31 is formed in a stepped shape with an intermediate surface 34 disposed on the light emitting surface side outside a bottom surface 33 as viewed in the cross-sectional view. That is, when the sidewall 31 is divided into an upper part and a lower part with the intermediate surface 34 located at a boundary therebetween, the inside dimension of the upper part of the inner peripheral surface of the sidewall 31 is larger than that of the lower part thereof.

At the bottom surface 33 enclosed by the sidewall, only one first lead 24 is exposed while the other second lead 25 is not exposed. The reflective layer 22a is provided on a part of the surface of the first lead 24 exposed at the bottom surface 33. The light emitting elements 10 are mounted on the surface (first region) 24A of the reflective layer 22a. A part of the first lead 24 as the surface 24B2 for connection is exposed to the intermediate surface 34, and the intermediate surface 34 is connected to one terminal of the wire 40. Specifically, the surface 24B2 for connection is formed to protrude from the surface of the reflective layer 22a toward the light emitting surface side so as to be exposed from the intermediate surface 34. Like the first lead 24, a part of the second lead 25 protrudes as a surface 25B2 for connection toward the light emitting surface side, and is exposed from the intermediate surface 34 with one end of the wire connected to the surface 25B for connection. The surfaces (first regions) 24A and 25A of the reflective layers are not formed on the surface for connection exposed to the intermediate surface 34. This is because the surface for connection is not a region where the light from the light emitting element 10 is directly applied with no improvement of the light output expected. In the third embodiment, however, the surfaces (first regions) 24A and 25A of the reflective layers and the separating surfaces (second regions) 24B and 25B may be formed at the surface for connection exposed to the intermediate surface 34. In this case, the wire 40 is electrically connected to each of the leads via the reflective layer 22a.

In the light emitting device with the above structure in the third embodiment, a part of the resin portion 30 does not need to be exposed at the bottom surface 33, and only the first lead 24 may as well be exposed at the entire region thereof. Thus, the surfaces (first regions) 24A of the reflective layer can be widely secured, whereby a number of light emitting elements 10 can be mounted to improve the light output. Further, the light emitting elements 10 can be uniformly arranged to suppress the variations in light emission.

In the light emitting device 300, a resin containing a phosphor member 61 with one or more phosphor materials diffused therein is charged into the lower part of the region inside the sidewall 31, and a resin containing a light scattering member 62 with one or more light scattering materials diffused therein is charged into the upper part of the region inside the sidewall 31. At this time, the resin containing a light scattering member does not substantially contain the phosphor. The term "not substantially contain the phosphor" as used herein means not only that no phosphor is contained, but also that even though a small amount of phosphor is contained, the light emitted from the light emitting element 10 is not confirmed to be absorbed in the phosphor. Thus, the light whose wavelength is converted can be further diffused, which can suppress the variations in light distribution.

The light emitting device according to the present invention may be applied to various light emitting devices, including a light source for illumination, a light source for a display, and the like.

DESCRIPTION OF REFERENCE NUMERALS 100, 200, 300: Light emitting device
10: Light emitting element
20: Package for light emitting device
21a, 21b: Base member
22a, 22b: Reflective layer
23a, 23b: Coated layer
30: Resin portion
31: Sidewall
32: Base portion
33: Bottom surface
34: Intermediate surface
40: Wire
50: Protective layer
60: Seal member
61: Resin containing Phosphor member
62: Resin containing Light scattering member
24A, 25A: Surface of reflective layer (first region)
24B, 25B: Separating surface (second region)

What is claimed is:

1. A package for a light emitting device comprising:
a resin portion having a sidewall;
a first lead having a reflective layer containing silver, the first lead being embedded in the resin portion such that the reflective layer is exposed inside the sidewall; and
a second lead having at least a part of a surface thereof exposed inside the sidewall, the second lead being embedded in the resin portion while being separated from the first lead,
wherein in the first lead, the reflective layer is provided spaced inward apart from a boundary between the first lead and the resin portion, and wherein a separating surface exposed between the boundary and the reflective layer is formed of a surface of metal containing silver in a smaller amount than that of the reflective layer.

2. The package according to claim 1, wherein the first lead comprises a base member and a reflective layer formed on an upper surface of the base member, and wherein the separating surface comprises a surface of the base member.

3. The package according to claim 1, wherein the first lead comprises a base member formed of metal and a coated layer formed on an upper surface of the base member, and wherein the separating surface comprises a surface of the coated layer.

4. The package according to claim 1, wherein the reflective layer is formed by electroplating.

5. The package according to claim 1, wherein the second lead has a second reflective layer containing silver, the second lead being embedded in the resin portion such that the second reflective layer is exposed inside the sidewall,
wherein in the second lead, the second reflective layer is provided spaced inward apart from the boundary between the first lead and the resin portion, and wherein a second separating surface exposed between the boundary and the second reflective layer is formed of a surface of a metal containing silver in a smaller amount than that of the second reflective layer.

6. The package according to claim 2, wherein the second lead has a second reflective layer containing silver, the second lead being embedded in the resin portion such that the second reflective layer is exposed inside the sidewall,
wherein in the second lead, the second reflective layer is provided spaced inward apart from the boundary between the first lead and the resin portion, and wherein a second separating surface exposed between the boundary and the second reflective layer is formed of a surface of a metal containing silver in a smaller amount than that of the second reflective layer.

7. The package according to claim 3, wherein the second lead has a second reflective layer containing silver, the second lead being embedded in the resin portion such that the second reflective layer is exposed inside the sidewall,
wherein in the second lead, the second reflective layer is provided spaced inward apart from the boundary between the first lead and the resin portion, and wherein a second separating surface exposed between the boundary and the second reflective layer is formed of a surface of a metal containing silver in a smaller amount than that of the second reflective layer.

8. The package according to claim 5, wherein the reflective layer and the second reflective layer are formed by electroplating.

9. The package according to claim 5, wherein the base member comprises a metal selected from a group of nickel, palladium, gold and a silver alloy.

10. The package according to claim 3, wherein the coated layer comprises a metal selected from a group of nickel, palladium, gold and a silver alloy.

11. The package according to claim 1, wherein a width of the separating surface is not less than 1 μm nor more than 20 μm.

12. The package according to claim 1, wherein a width of the separating surface is not less than 3 μm nor more than 10 μm.

13. The package according to claim 1, wherein a thickness of the reflective layer is not less than 0.1 μm nor more than 10 μm.

14. The package according to claim 1, wherein a thickness of the reflective layer is not less than 0.5 μm nor more than 5 μm.

15. A light emitting device comprising:
   a package according to claim 1;
   one or more light emitting elements provided on the reflective layer; and
   a protective layer covering the first lead and the light emitting element.

16. A light emitting device comprising:
   a package according to claim 5;
   one or more light emitting elements provided on the reflective layer and the second reflective layer; and
   a protective layer covering the first and second leads and the light emitting elements.

17. The light emitting device according to claim 15, wherein the protective layer is formed by an atomic layer deposition method.

18. The light emitting device according to claim 16, wherein the protective layer is formed by an atomic layer deposition method.

19. The light emitting device according to claim 15, wherein the protective layer is made of aluminum oxide or silicon oxide.

20. The light emitting device according to claim 15, wherein a p-electrode and an n-electrode of the light emitting element are respectively electrically connected to the first and second leads via wires.

* * * * *